(12) United States Patent
Rossi et al.

(10) Patent No.: US 8,638,132 B2
(45) Date of Patent: Jan. 28, 2014

(54) TRANSMISSION CHANNEL FOR ULTRASOUND APPLICATIONS

(75) Inventors: Sandro Rossi, Pavia (IT); Giulio Ricotti, Broni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/538,802

(22) Filed: Jun. 29, 2012

(65) Prior Publication Data

US 2012/0268186 A1    Oct. 25, 2012

Related U.S. Application Data

(63) Continuation-in-part of application No. PCT/EP2010/005931, filed on Sep. 29, 2010, and a continuation-in-part of application No. PCT/EP2010/005932, filed on Sep. 29, 2010, and a continuation-in-part of application No. PCT/EP2010/005927, filed on Sep. 29, 2010, and a continuation-in-part of application No. PCT/EP2010/005930, filed on Sep. 29, 2010.

(30) Foreign Application Priority Data

| Dec. 30, 2009 | (IT) | MI2009A2338 |
| Dec. 30, 2009 | (IT) | MI2009A2339 |
| Dec. 30, 2009 | (IT) | MI2009A2340 |
| Dec. 30, 2009 | (IT) | MI2009A2341 |

(51) Int. Cl.
  *H03B 1/00* (2006.01)
  *H03K 3/00* (2006.01)

(52) U.S. Cl.
  USPC ..................................... 327/108

(58) Field of Classification Search
  USPC .................................................. 327/108–112
  See application file for complete search history.

(56) References Cited

U.S. PATENT DOCUMENTS

| 3,958,127 | A | 5/1976 | Faulhaber et al. |
| 5,414,378 | A * | 5/1995 | Edgar et al. .................... 327/143 |
| 5,475,342 | A * | 12/1995 | Nakamura et al. ............. 330/136 |
| 6,050,945 | A | 4/2000 | Peterson et al. |
| 6,269,052 | B1 | 7/2001 | Oppelt |
| 6,540,677 | B1 | 4/2003 | Angelsen et al. |
| 7,324,167 | B2 | 1/2008 | Miller |
| 7,432,737 | B2 * | 10/2008 | Yoshida ........................... 326/46 |
| 7,760,272 | B2 | 7/2010 | Miller |
| 7,888,985 | B2 * | 2/2011 | Osaka ............................ 327/333 |

(Continued)

FOREIGN PATENT DOCUMENTS

WO    2005/078931 A1    8/2005

*Primary Examiner* — Adam Houston
(74) *Attorney, Agent, or Firm* — Seed IP Law Group PLLC (57) ABSTRACT

A transmission channel includes at least one high voltage buffer block having buffer transistors and respective buffer diodes, being electrically coupled between respective voltage reference terminals, these buffer transistors being also coupled to a clamping block, in turn including clamping transistors connected to at least one output terminal of this transmission channel through diodes coupled to prevent the body diodes of the clamping transistors from conducting. The transmission channel includes at least one reset circuit having diodes and being electrically coupled between circuit nodes of the high voltage buffer block and of the clamping block, these circuit nodes being in correspondence with conduction terminals of the transistors comprised into the high voltage buffer block and into the clamping block.

27 Claims, 2 Drawing Sheets

(56) References Cited

U.S. PATENT DOCUMENTS

| | | | |
|---|---|---|---|
| 8,159,267 B2* | 4/2012 | Yoshida | 326/46 |
| 2002/0070805 A1 | 6/2002 | Ausserlechner et al. | |
| 2004/0227556 A1* | 11/2004 | Ohmori | 327/309 |
| 2005/0139931 A1 | 6/2005 | Arai | |
| 2008/0116751 A1 | 5/2008 | Kihara et al. | |
| 2009/0206676 A1 | 8/2009 | Chu et al. | |
| 2010/0067915 A1 | 3/2010 | Fukasaku et al. | |
| 2011/0115540 A1* | 5/2011 | Kamp | 327/321 |
| 2012/0268092 A1* | 10/2012 | Rossi et al. | 323/282 |
| 2012/0268186 A1* | 10/2012 | Rossi et al. | 327/309 |
| 2012/0268189 A1* | 10/2012 | Rossi et al. | 327/333 |
| 2012/0268200 A1* | 10/2012 | Rossi et al. | 327/574 |

\* cited by examiner

TRANSMISSION CHANNEL FOR ULTRASOUND APPLICATIONS

BACKGROUND

1. Technical Field

The present disclosure relates to a transmission channel. The disclosure, for example, relates to a transmission channel for ultrasound applications and the following description is made with reference to this field of application by way of illustration only.

2. Description of the Related Art

Sonography or ultrasonography is a system of medical diagnostic testing that uses ultrasonic waves or ultrasounds and is based on the principle of the transmission of the ultrasounds and of the emission of echo and is widely used in the internistic, surgical and radiological field.

The ultrasounds being normally used are comprised between 2 and 20 MHz. The frequency is chosen by taking into consideration that higher frequencies have a greater image resolving power, but penetrate less in depth in the subject under examination.

These ultrasounds are normally generated by a piezoceramic crystal inserted in a probe being maintained in direct contact with the skin of the subject with the interposition of a suitable gel (being suitable for eliminating the air between probe and subject's skin, allowing the ultrasounds to penetrate in the anatomic segment under examination). The same probe is able to collect a return signal or echo, which is suitably processed by a computer and displayed on a monitor.

In particular, the ultrasounds that reach a variation point of the acoustic impedance, and thus for example an internal organ, are partially reflected and the reflected percentage conveys information about the impedance difference between the crossed tissues. It is to be noted that, the big impedance difference between a bone and a tissue being considered, with the sonography it is not possible to see behind a bone, which causes a substantially total reflection of the ultrasounds, while air or gas zones give "shade", causing a partial reflection of the ultrasounds.

The time employed by an ultrasonic wave for carrying out the path of going, reflection and return is provided to the computer, which calculates the depth wherefrom the echo has come, thus identifying the division surface between the crossed tissues (corresponding to the variation point of the acoustic impedance and thus to the depth wherefrom the echo comes).

Substantially, an ultrasonographer, in particular a diagnostic apparatus based on the ultrasound sonography, may comprise three parts:

- a probe comprising at least one transducer, in particular of the ultrasonic type, which transmits and receives an ultrasound signal;
- an electronic system that drives the transducer for the generation of the ultrasound signal or pulse to be transmitted and receives an echo signal of return at the probe of this pulse, processing in consequence the received echo signal; and
- a displaying system of a corresponding sonography image processed starting from the echo signal received by the probe.

In particular, the word transducer generally indicates an electric or electronic device that converts a type of energy relative to mechanical and physical quantities into electric signals. In a broad sense, a transducer is sometimes defined as any device that converts energy from one form to another, so that this latter can be re-processed, for example, manually, by other machines, or combinations thereof. Many transducers are both sensors and actuators. An ultrasonic transducer usually comprises a piezoelectric crystal that is suitably biased for causing its deformation and the generation of the ultrasound signal or pulse.

Figure 1:
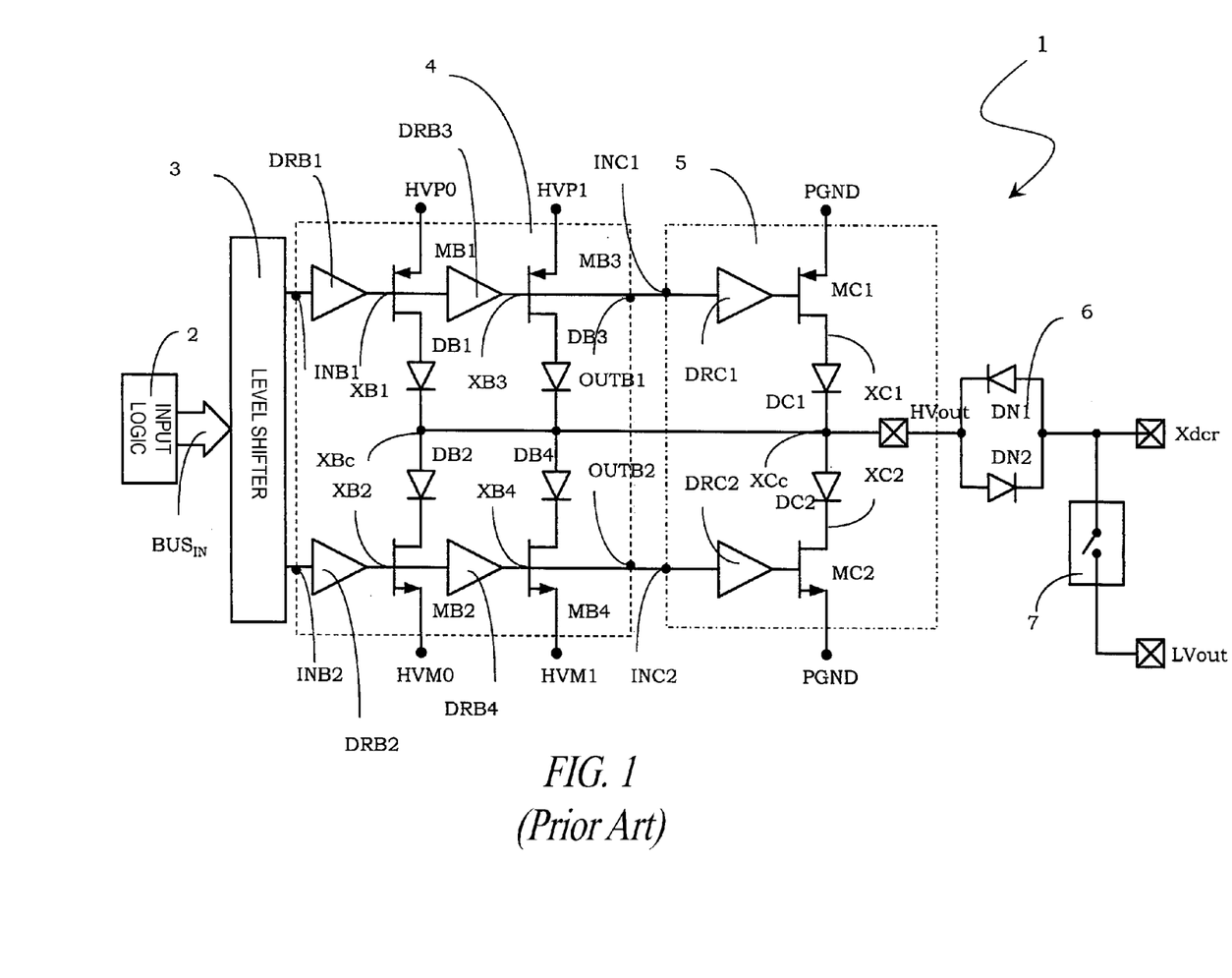
FIG. 1 schematically shows a transmission channel for ultrasound applications realized according to the prior art.

A typical transmission channel or TX channel being used in these applications is schematically shown in FIG. 1.

In particular, the transmission channel 1 comprises an input logic 2 that drives, in correspondence with an input bus $BUS_{IN}$, a level shifter 3, in turn connected to a high voltage buffer block 4. The high voltage buffer block 4 is electrically coupled between pairs of high voltage reference terminals, respectively higher HVP0 and HVP1 and lower HVM0 and HVM1, and has a pair of input terminals, INB1 and INB2, connected to the level shifter 3, as well as a pair of output terminals, OUTB1 and OUTB2, connected to a corresponding pair of input terminals, INC1 and INC2 of a clamping block 5.

Furthermore, the clamping block 5 is connected to a clamp voltage reference terminal PGND and has an output terminal corresponding to a first output terminal HVout of the transmission channel 1, in turn connected, through an antinoise block 6, to a connection terminal Xdcr for the transducer to be driven through the transmission channel 1.

A high voltage switch 7 is electrically coupled between the connection terminal Xdcr and a second output terminal LVout of the transmission channel 1.

More in detail, the high voltage buffer block 4 comprises a first branch comprising a first buffer transistor MB1 and a first buffer diode DB1, electrically coupled, in series to each other, between a first higher voltage reference terminal HVP0 and a buffer central node XBc, as well as a second buffer diode DB2 and a second buffer transistor MB2, being electrically coupled, in series to each other, between the buffer central node XBc and a first lower voltage reference terminal HVM0. The first and the second buffer transistor, MB1 and MB2, have respective control or gate terminals in correspondence with a first XB1 and a second inner circuit node XB2 of the high voltage buffer block 4 and connected to, and driven by, a first buffer input driver DRB1 and a second buffer input driver DRB2, in turn connected to the level shifter 3 in correspondence with the first and the second input terminals, INB1 and INB2, of the high voltage buffer block 4.

The high voltage buffer block 4 also comprises, in parallel to the first branch, a second branch in turn comprising a third buffer transistor MB3 and a third buffer diode DB3, electrically coupled, in series to each other, between a second higher voltage reference terminal HVP1 and the buffer central node XBc, as well as a fourth buffer diode DB4 and a fourth buffer transistor MB4, electrically coupled, in series to each other, between the buffer central node XBc and a second lower voltage reference terminal HVM1. The third and fourth buffer transistor, MB3 and MB4, have respective control or gate terminals in correspondence with a third XB3 and a fourth inner circuit node XB4 of the high voltage buffer block 4 and connected to, and driven by, a third DRB3 and a fourth buffer input driver DRB4, in turn connected to the first XB1 and to the second inner circuit node XB2 and then to the first DRB1 and to the second buffer input driver DRB2, respectively, as well as to a first OUTB1 and to a second output terminal OUTB2.

In particular, in the example of the figure, the first and third buffer transistors, MB1 and MB3, are high voltage P-channel MOS (Metal Oxide Semiconductor) transistors (HV Pmos) while the second and fourth buffer transistors, MB2 and MB4, are high voltage N-channel MOS transistors (HV Nmos). Moreover, the buffer diodes, DB1, DB2, DB3 and DB4, are high voltage diodes (HV diode).

The clamping block 5 has in turn a first input terminal INC1 and a second input terminal INC2, respectively connected to the first OUTB1 and second output terminal OUTB2 of the high voltage buffer block 4.

In particular, the clamping block 5 comprises a first clamp driver DRC1 connected between the first input terminal INC1 and a control or gate terminal of a first clamp transistor MC1, in turn electrically coupled, in series with a first clamp diode DC1, between the clamp voltage reference terminal PGND, in particular a ground, and a clamp central node XCc. The first clamp transistor MC1 and the first clamp diode DC1 are interconnected in correspondence with a first clamp circuit node XC1.

The clamping block 5 also comprises a second clamp driver DRC2 connected between the second input terminal INC2 and a control or gate terminal of a second clamp transistor MC2, in turn electrically coupled, in series with a second clamp diode DC2, between the clamp central node XCc and the clamp voltage reference terminal PGND. The second clamp transistor MC2 and the second clamp diode DC2 are interconnected in correspondence with a second clamp circuit node XC2.

The clamp central node XCc is also connected to the first output terminal HVout of the transmission channel 1, in turn connected to the connection terminal Xdcr through an antinoise block 6 comprising respective first and second antinoise diodes, DN1 and DN2, connected in antiparallel, e.g., by having the anode terminal of the first diode connected to the cathode terminal of the second one and vice versa, between the first output terminal Hvout and the connection terminal Xdcr.

In particular, in the example of the figure, the first clamp transistor MC1 is a high voltage P-channel MOS transistor (HV Pmos) while the second clamp transistor MC2 is a high voltage N-channel MOS transistor (HV Nmos). Moreover, the clamp diodes, DC1 and DC2, are high voltage diodes (HV diode) while the antinoise diodes, DN1 and DN2, are low voltage diodes (LV diode).

When the clamping block 5 is on, the first output terminal HVout is at a voltage value substantially corresponding to the ground voltage value GND.

After a pulse cycle, the anode terminals of the first DB1 and third buffer diode DB3 and the cathode terminals of the second DB2 and fourth buffer diode DB4 stabilize themselves at a voltage depending on different factors such as the supply voltage value, inner capacities, which one and how many transistors are used for the switch, the switching frequency etc.

This means that any successive pulse train finds a different, non-defined initial condition.

By changing the initial status also the output wave form is modified with the consequence that the input control being identical it is possible to obtain different outputs. In other words, the wave form of the output signal is function of the input signals and of the initial condition resulting from the previously occurred switches thus creating a sort of "memory effect".

BRIEF SUMMARY

An embodiment uses suitable high voltage diodes connected to the inner nodes of the high voltage buffer block of the transmission channel to bias conditions between a pulse cycle and another one.

In an embodiment, a transmission channel comprises at least one high voltage buffer block comprising buffer transistors and respective buffer diodes, being electrically coupled between respective voltage reference terminals, said buffer transistors being also connected to a clamping block, in turn comprising clamping transistors connected to at least one output terminal of said transmission channel through diodes connected to prevent the body diodes of said clamping transistors from conducting, and at least one reset circuit comprising diodes and being electrically coupled between circuit nodes of said high voltage buffer block and of said clamping block, said circuit nodes being in correspondence with conduction terminals of said transistors comprised into said high voltage buffer block and into said clamping block.

At least some embodiments may include the following supplementary and optional characteristics, taken alone or in combination.

In an embodiment, said clamping block can comprise at least one first clamp transistor electrically coupled, in series with a first clamp diode, between a clamp voltage reference terminal and a clamp central node and interconnected in correspondence with a first clamp circuit node, as well as a second clamp transistor electrically coupled, in series with a second clamp diode, between said clamp voltage reference terminal and said clamp central node and interconnected in correspondence with a second clamp circuit node and wherein said high voltage buffer block comprises at least one first branch in turn including a first buffer transistor and a first buffer diode, electrically coupled, in series to each other, between a first higher voltage reference terminal and a buffer central node and interconnected in correspondence with a first memory node, as well as a second buffer diode and a second buffer transistor, electrically coupled, in series to each other, between said buffer central node and a first lower voltage reference terminal and interconnected in correspondence with a second memory node, said reset circuit can comprise:

a first memory diode, electrically coupled between said first memory node and said first clamp circuit node; and a second memory diode, electrically coupled between said second memory diode and said second clamp circuit node.

In an embodiment, said first memory diode can have a cathode terminal connected to said first memory node and an anode terminal connected to said first clamp circuit node and said second memory diode can have an anode terminal connected to said second memory node and a cathode terminal connected to said second clamp circuit node.

In an embodiment, said first memory node can be connected to an anode terminal of said first buffer diode and said first clamp circuit node can be connected to an anode terminal of said first clamp diode and said second memory node can be connected to a cathode terminal of said second buffer diode and said second clamp circuit node can be connected to a cathode terminal of said second clamp diode.

In an embodiment, said first memory node can be in correspondence with a drain terminal of said first buffer transistor and said second memory node can be in correspondence with a drain terminal of said second buffer transistor.

In an embodiment, said high voltage buffer block can also comprise, in parallel to said first branch, a second branch in turn including a third buffer transistor and a third buffer diode, electrically coupled, in series to each other, between a second higher voltage reference terminal and said buffer central node interconnected in correspondence with a third memory node, as well as a fourth buffer diode and a fourth buffer transistor, electrically coupled, in series to each other, between said buffer central node and a second lower voltage reference terminal and interconnected in correspondence with a fourth memory node, said reset circuit can further comprise:

a third memory diode, electrically coupled between said third memory node and said first clamp circuit node; and
a fourth memory diode, electrically coupled between said fourth memory node and said second clamp circuit node.

In an embodiment, said third memory diode can have a cathode terminal connected to said third memory node and an anode terminal connected to said first clamp circuit node and said fourth memory diode can have an anode terminal connected to said fourth memory node and a cathode terminal connected to said second clamp circuit node.

In an embodiment, said third memory node can be connected to an anode terminal of said third buffer diode and said first clamp circuit node can be connected to an anode terminal of said first clamp diode and said fourth memory node can be connected to a cathode terminal of said fourth buffer diode and said second clamp circuit node can be connected to a cathode terminal of said second clamp diode.

In an embodiment, said third memory node can be in correspondence with a drain terminal of said third buffer transistor and said fourth memory node can be in correspondence with a drain terminal of said fourth buffer transistor.

In an embodiment, said clamping block can comprise respective first and second clamp drivers connected to control terminals of said first and second clamp transistors.

In an embodiment, said high voltage buffer block can comprise respective buffer drivers connected to control terminals of said buffer transistors.

In an embodiment, said transmission channel can further comprise an antinoise block between said at least one output terminal and one connection terminal for a load to be driven.

In an embodiment, said load can be a piezoelectric transducer.

In an embodiment, said transmission channel can further comprise a high voltage switch electrically coupled between said connection terminal and a further output terminal of such a transmission channel.

In an embodiment, a device comprises: a voltage clamping block including: an output; and a first clamp transistor and first clamp diode pair coupled to the output with the first clamp diode coupled in anti-series to a body diode of the first clamp transistor; and a reset block including a first memory diode coupled to a conduction terminal of the first clamp transistor and configured to couple to a conduction terminal of a first transistor of a high-voltage buffer. In an embodiment, said first clamp transistor is coupled in series with the first clamp diode, between a clamp voltage reference terminal and a clamp central node, the voltage clamping block comprises a second clamp transistor and second clamp diode pair, coupled in series between said clamp voltage reference terminal and said clamp central node, with the second clamp diode being coupled in anti-series with a body diode of the second clamp transistor, and the reset block comprises a second memory diode coupled to a conduction terminal of the second clamp transistor and configured to couple to a conduction terminal of a second transistor of the high-voltage buffer. In an embodiment, the device comprises the high-voltage buffer, wherein the high voltage buffer includes at least one first branch having the first buffer transistor and a first buffer diode coupled in series between a first higher voltage reference terminal and a buffer central node, and a second buffer diode and the second buffer transistor coupled in series between said buffer central node and a first lower voltage reference terminal. In an embodiment, said first memory diode has a cathode coupled to said conduction terminal of the first buffer transistor and an anode coupled to said conduction terminal of the first clamp transistor and said second memory diode has an anode coupled to said conduction terminal of the second buffer transistor and a cathode coupled to said conduction terminal of the second clamp transistor. In an embodiment, said conduction terminal of the first buffer transistor is coupled to an anode of said first buffer diode, said conduction terminal of the first clamp transistor is connected to an anode of said first clamp diode, said conduction terminal of the second buffer transistor is coupled to a cathode of said second buffer diode, and said conduction terminal of the second clamp transistor is coupled to a cathode of said second clamp diode. In an embodiment, said conduction terminal of the first buffer transistor is a drain of said first buffer transistor and said conduction terminal of the second buffer transistor is a drain of said second buffer transistor. In an embodiment, said high-voltage buffer comprises, in parallel to said first branch, a second branch, the second branch including a third buffer transistor and a third buffer diode coupled in series between a second higher voltage reference terminal and said buffer central node, and a fourth buffer diode and a fourth buffer transistor coupled in series between said buffer central node and a second lower voltage reference terminal, and said reset block comprises: a third memory diode coupled between a conduction terminal of the third buffer transistor and the conduction terminal of the first clamp transistor; and a fourth memory diode coupled between a conduction terminal of the fourth buffer transistor and the conduction terminal of the second clamp transistor. In an embodiment, said third memory diode has a cathode coupled to said conduction terminal of the third buffer transistor and an anode coupled to said conduction terminal of the first clamp transistor and said fourth memory diode has an anode coupled to the conduction terminal of said fourth buffer transistor and a cathode coupled to said conduction terminal of the second clamp transistor. In an embodiment, said conduction terminal of the third buffer transistor is coupled to an anode of said third buffer diode, said conduction terminal of the first clamp transistor is coupled to an anode of said first clamp diode, said conduction terminal of the fourth buffer transistor is coupled to a cathode of said fourth buffer diode, and said conduction terminal of the second clamp transistor is coupled to a cathode of said second clamp diode. In an embodiment, said conduction terminal of the third buffer transistor is a drain of said third buffer transistor and said conduction terminal of the fourth buffer transistor is a drain of said fourth buffer transistor. In an embodiment, said voltage clamping block comprises a first clamp driver coupled to a control of the first clamp transistor and a second clamp driver coupled to a control of the second clamp transistor. In an embodiment, said high-voltage buffer comprises respective buffer drivers connected to control terminals of said buffer transistors. In an embodiment, the device further comprises an anti-noise block coupled between the output of the voltage clamping block and an output of the device. In an embodiment, the output of the device is configured to drive a piezoelectric transducer. In an embodiment, the device further comprises a high-voltage switch coupled between said output of the device and a further output of the device.

In an embodiment, a system comprises: a high-voltage buffer block including a plurality of buffer transistors; a high-voltage clamp including a plurality of clamp transistors and a plurality of clamp diodes, each clamp diode of the plurality coupled in series with a respective clamp transistor and in anti-series with a body diode of the respective clamp transistor; and a clamp reset block including a plurality of diodes, each diode of the plurality being coupled between a conduction terminal of a clamp transistor and a conduction terminal of a buffer transistor. In an embodiment, the system further comprises a level shifter coupled to the high-voltage buffer block. In an embodiment, the system further comprises an anti-noise block coupled to the high-voltage clamp. In an embodiment, the system further comprises a high-voltage switch coupled to the anti-noise block. In an embodiment, the system further comprises a piezoelectric transducer coupled to the voltage clamp. In an embodiment, the system comprises an anti-noise block coupled between the piezoelectric transducer and the high-voltage clamp.

In an embodiment, a transmission channel comprises: means for generating high-voltage pulses; means for clamping an output of the transmission channel to a reference voltage; and means for biasing the transmission channel between pulses. In an embodiment, the means for biasing comprises a plurality of diodes coupled between the means for generating high-voltage pulses and the means for clamping. In an embodiment, the transmission channel further comprises means for reducing noise coupled to the means for clamping.

In an embodiment, a method comprises: transmitting a series of high-voltage pulses through a transmission channel; clamping an output of the transmission channel to a reference voltage between pulses; and biasing the transmission channel between pulses. In an embodiment, the method further comprises: driving a piezoelectric transducer with the series of pulses. In an embodiment, the biasing the transmission channel comprises biasing conduction terminals of transistors of a voltage clamp of the transmission channel with respect to conduction terminals of transistors of a buffer of the transmission channel.

The characteristics and the advantages of transmission channels of various embodiments will be apparent from the following description of an embodiment thereof given by way of indicative and non-limiting example with reference to the annexed drawings.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations, such as, for example, high-voltage transistors, diodes, etc., are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 2:
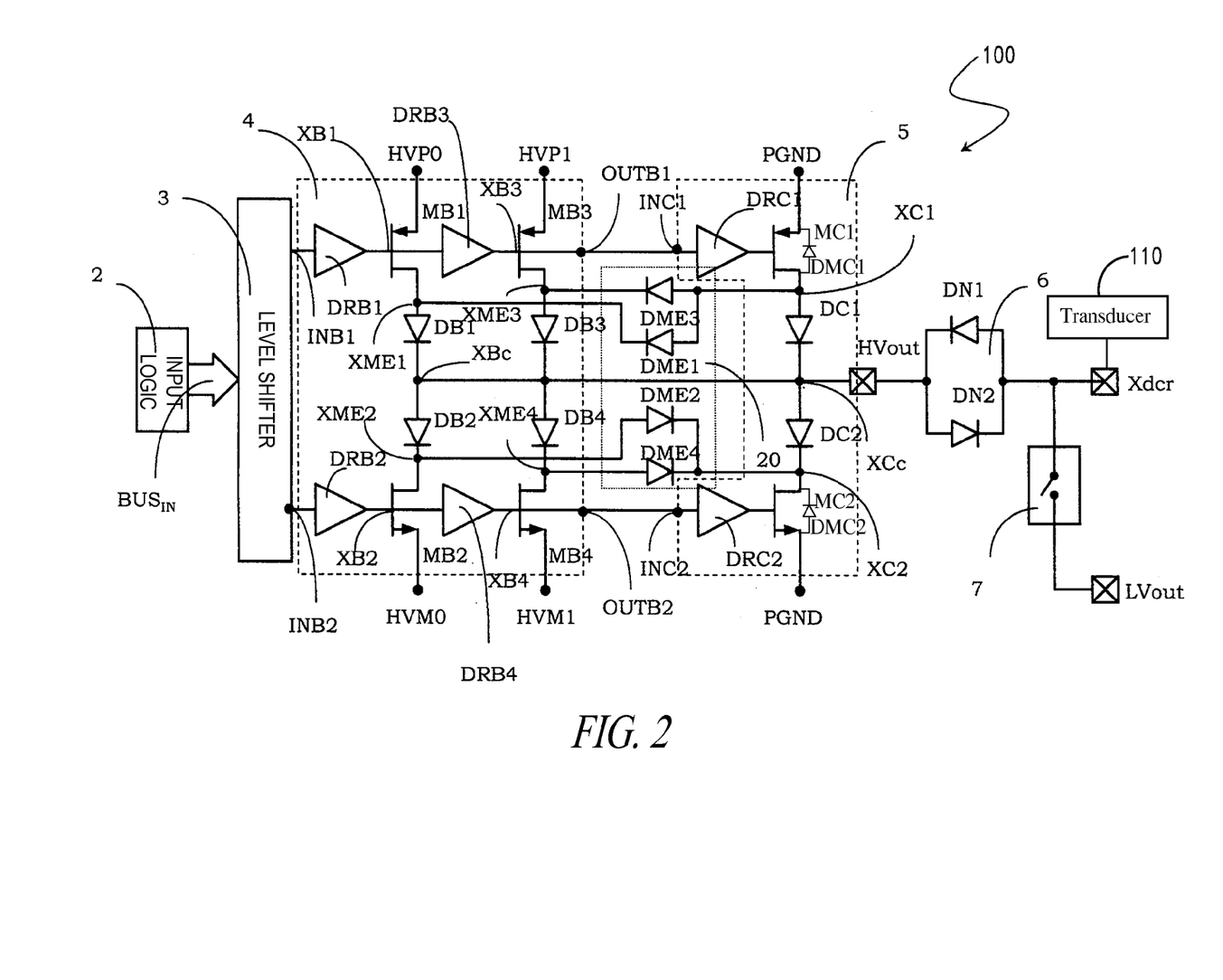
FIG. 2 schematically shows a transmission channel, in particular for ultrasound applications, realized according to an embodiment.

With reference to these figures, and in particular to FIG. 2, a transmission channel 100 is described for ultrasound applications.

Elements being structurally and functionally correspondent to the transmission channel described in relation to the prior art and shown in FIG. 1 will be given the same alphanumeric references for sake of simplicity, unless the context indicates otherwise.

In its more general form, the transmission channel 100 of FIG. 2 is of the type comprising at least one high voltage buffer block 4 in turn comprising buffer transistors and respective buffer diodes, being electrically coupled between respective voltages. The buffer transistors are also connected to a clamping block 5, in turn comprising clamping transistors connected to at least one output terminal HVout of the transmission channel 100 through diodes connected to prevent the body diodes DMC1, DMC2 of the clamping transistors from conducting. Moreover, the transmission channel 100 comprises at least one reset circuit 20 comprising diodes and being electrically coupled between circuit nodes of the high voltage buffer block 4 and of the clamping block 5, said circuit nodes being in correspondence with conduction terminals of the transistors comprised into the high voltage buffer block 4 and into the clamping block 5.

In an embodiment, the reset circuit 20 is suitably coupled to the inner nodes of the high voltage buffer block 4 and of the clamping block 5 that are to be biased.

More in detail, in an embodiment, the reset circuit 20 is coupled to the interconnection circuit nodes between the transistors and the buffer diodes of the high voltage buffer block 4 and the clamp circuit nodes of the clamping block 5. For example, the reset circuit 20 is coupled:

to a first memory node XME1, between the first buffer transistor MB1 and the first buffer diode DB1;
to a second memory node XME2, between the second buffer transistor MB2 and the second buffer diode DB2;
to a third memory node XME3, between the third buffer transistor MB3 and the third buffer diode DB3;
to a fourth memory node XME4, between the fourth buffer transistor MB4 and the fourth buffer diode DB4;
to the first clamp circuit node XC1, between the first clamp transistor MC1 and the first clamp diode DC1; and
to the second clamp circuit node XC2, between the second clamp transistor MC2 and the second clamp diode DC2.

As previously seen, the clamping block 5 comprises the first clamp transistor MC1 electrically coupled, in series with the first clamp diode DC1, between the clamp voltage reference terminal PGND and the clamp central node XCc and interconnected in correspondence with the first clamp circuit node XC1, as well as the second clamp transistor MC2 electrically coupled, in series with the second clamp diode DC2, between the clamp voltage reference terminal PGND and the clamp central node XCc and interconnected in correspondence with the second clamp circuit node XC2.

Moreover, the high voltage buffer block 4 comprises at least one first branch in turn including the first buffer transistor MB1 and the first buffer diode DB1, being electrically coupled, in series to each other, between a first higher voltage reference terminal HVP0 and a buffer central node XBc and interconnected in correspondence with the first memory node XME1, as well as the second buffer diode DB2 and the second buffer transistor MB2, being electrically coupled, in series to each other, between the buffer central node XBc and a first lower voltage reference terminal HVM0 and interconnected in correspondence with the second memory node XME2.

In an embodiment, the reset circuit 20 comprises respective memory diodes electrically coupled between these circuit nodes, including:

a first memory diode DME1, being electrically coupled between the first memory node XME1 and the first clamp circuit node XC1; and a second memory diode DME2, being electrically coupled between the second memory node XME2 and the second clamp circuit node XC2.

As illustrated, the first memory diode DME1 has a cathode terminal connected to the first memory node XME1 and an anode terminal connected to the first clamp circuit node XC1. The second memory diode DME2 has an anode terminal connected to the second memory node XME2 and a cathode terminal connected to the second clamp circuit node XC2.

Moreover, as previously seen, the high voltage buffer block 4 comprises, in parallel to the first branch, a second branch in turn including the third buffer transistor MB3 and the third buffer diode DB3, being electrically coupled, in series to each other, between a second higher voltage reference terminal HVP1 and the buffer central node XBc and interconnected in correspondence with the third memory node XME3, as well as the fourth buffer diode DB4 and the fourth buffer transistor MB4, being electrically coupled, in series to each other, between the buffer central node XBc and a second lower voltage reference terminal HVM1 and interconnected in correspondence with the fourth memory node XME4.

The reset circuit 20 comprises:

a third memory diode DME3, being electrically coupled between the third memory node XME3 and the first clamp circuit node XC1; and a fourth memory diode DME4, being electrically coupled between the fourth memory node XME4 and the second clamp circuit node XC2.

The third memory diode DME3 has a cathode terminal connected to the third memory node XME3 and an anode terminal connected to the first clamp circuit node XC1. The fourth memory diode DME4 has an anode terminal connected to the fourth memory node XME4 and a cathode terminal connected to the second clamp circuit node XC2.

In an embodiment, the memory diodes DME1, DME2, DME3 and DME4 are high voltage diodes (HV diode).

The reset circuit 20 forces all the circuit nodes whereto it is connected into a neighborhood of a ground reference value and facilitates the transmission channel 100 restarting under a same or similar condition at any pulse cycle.

It is to be noted that the memory circuit nodes correspond to the drain terminals of the corresponding buffer transistors of the high voltage buffer block 4. Moreover, the memory diodes are coupled so as to have terminals being not homologue with the buffer diodes.

The first memory diode DME1 has the cathode terminal connected to the anode terminal of the first buffer diode DB1, the second memory diode DME2 has the anode terminal connected to the cathode terminal of the second buffer diode DB2, the third memory diode DME3 has the cathode terminal connected to the anode terminal of the third buffer diode DB3, and the fourth memory diode DME4 has the anode terminal connected to the cathode terminal of the fourth buffer diode DB4.

A previously seen, the clamping block 5 and the high voltage buffer block 4 comprise respective clamp and buffer drivers connected to control terminals of the clamp and buffer transistor, respectively.

Furthermore, the transmission channel 100 comprises an anti-noise block 6 electrically coupled between the output terminal HVout and a connection terminal Xdcr for a load to be driven, as illustrated a piezoelectric transducer 110.

The transmission channel 100 comprises a high voltage switch 7 electrically coupled between the connection terminal Xdcr and a further output terminal LVout thereof.

In an embodiment, the transmission channel 100 is particularly used for the driving of a piezoelectric transducer for ultrasound applications.

In substance, the reset circuit 20, after each clamping step realized by the clamping block 5, forces the drain terminal voltage value of the buffer transistors, which are high power MOS transistors, comprised into the high voltage buffer block 4 to voltage values near to a ground reference value, so that successive pulse cycles applied to the transmission channel 100 restart all from substantially a same initial condition. In particular, in the case of ultrasound applications, this limits the differences between ultrasound pulse and ultrasound pulse.

Obviously a technician of the field, for example with the aim of meeting incidental and specific needs, will be allowed to introduce several modifications and variations to the transmission channel above described, all comprised within the scope of this disclosure.

Some embodiments may take the form of computer program products. For example, according to one embodiment there is provided a computer readable medium comprising a computer program adapted to perform one or more of the methods described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), discrete circuitry, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology. In some embodiments, some of the modules or controllers separately described herein may be combined, split into further modules and/or split and recombined in various manners.

The various embodiments described above can be combined to provide further embodiments. Concurrently filed U.S. patent application Ser. Nos. 13/538,598, 13/538,821 and 13/538,840 are incorporated herein by reference in their entireties (respectively, each of which claims priority to Italian Application Nos. MI09A002338, MI09A002339, MI09A002340 and MI09A002341, all filed on Dec. 30, 2009, and to International Application Nos. PCT/EP2010/005927, PCT/EP2010/005930, PCT/EP2010/005931 and PCT/EP2010/005932, all filed on Sep. 29, 2010). Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a voltage clamping block including:
  an output terminal; and
  a first clamp transistor and first clamp diode pair coupled to the output terminal with the first clamp diode coupled in anti-series to a body diode of the first clamp transistor; and
a reset block including a first memory diode coupled to a conduction terminal of the first clamp transistor and configured to couple to a conduction terminal of a first transistor of a high-voltage buffer.

2. The device of claim 1 wherein,
said first clamp transistor is coupled in series with the first clamp diode, between a clamp voltage reference terminal and a clamp central node,
the voltage clamping block comprises a second clamp transistor and second clamp diode pair, coupled in series between said clamp voltage reference terminal and said clamp central node, with the second clamp diode being coupled in anti-series with a body diode of the second clamp transistor, and
the reset block comprises a second memory diode coupled to a conduction terminal of the second clamp transistor and configured to couple to a conduction terminal of a second transistor of the high-voltage buffer.

3. The device of claim 2, further comprising the high-voltage buffer, wherein the high voltage buffer includes at least one first branch having the first buffer transistor and a first buffer diode coupled in series between a first higher voltage reference terminal and a buffer central node, and a second buffer diode and the second buffer transistor coupled in series between said buffer central node and a first lower voltage reference terminal.

4. The device of claim 3 wherein said first memory diode has a cathode coupled to said conduction terminal of the first buffer transistor and an anode coupled to said conduction terminal of the first clamp transistor and said second memory diode has an anode coupled to said conduction terminal of the second buffer transistor and a cathode coupled to said conduction terminal of the second clamp transistor.

5. The device of claim 3 wherein,
said conduction terminal of the first buffer transistor is coupled to an anode of said first buffer diode,
said conduction terminal of the first clamp transistor is connected to an anode of said first clamp diode,
said conduction terminal of the second buffer transistor is coupled to a cathode of said second buffer diode, and
said conduction terminal of the second clamp transistor is coupled to a cathode of said second clamp diode.

6. The device of claim 4 wherein said conduction terminal of the first buffer transistor is a drain of said first buffer transistor and said conduction terminal of the second buffer transistor is a drain of said second buffer transistor.

7. The device of claim 3 wherein said high-voltage buffer comprises a second branch, the second branch including a third buffer transistor and a third buffer diode coupled in series between a second higher voltage reference terminal and said buffer central node, and a fourth buffer diode and a fourth buffer transistor coupled in series between said buffer central node and a second lower voltage reference terminal, and said reset block comprises:

a third memory diode coupled between a conduction terminal of the third buffer transistor and the conduction terminal of the first clamp transistor; and
a fourth memory diode coupled between a conduction terminal of the fourth buffer transistor and the conduction terminal of the second clamp transistor.

8. The device of claim 7 wherein said third memory diode has a cathode coupled to said conduction terminal of the third buffer transistor and an anode coupled to said conduction terminal of the first clamp transistor and said fourth memory diode has an anode coupled to the conduction terminal of said fourth buffer transistor and a cathode coupled to said conduction terminal of the second clamp transistor.

9. The device of claim 7 wherein,
said conduction terminal of the third buffer transistor is coupled to an anode of said third buffer diode,
said conduction terminal of the first clamp transistor is coupled to an anode of said first clamp diode,
said conduction terminal of the fourth buffer transistor is coupled to a cathode of said fourth buffer diode, and
said conduction terminal of the second clamp transistor is coupled to a cathode of said second clamp diode.

10. The device of claim 7 wherein said conduction terminal of the third buffer transistor is a drain of said third buffer transistor and said conduction terminal of the fourth buffer transistor is a drain of said fourth buffer transistor.

11. The device of claim 2 wherein said voltage clamping block comprises a first clamp driver coupled to a control of the first clamp transistor and a second clamp driver coupled to a control of the second clamp transistor.

12. The device of claim 3 wherein said high-voltage buffer comprises respective buffer drivers connected to control terminals of said buffer transistors.

13. The device of claim 1, further comprising an anti-noise block coupled between the output of the voltage clamping block and an output of the device.

14. The device of claim 13 wherein the output of the device is configured to drive a piezoelectric transducer.

15. The device of claim 13, further comprising a high-voltage switch coupled between said output of the device and a further output of the device.

16. A system, comprising:
a high-voltage buffer block including a plurality of buffer transistors;
a high-voltage clamp including a plurality of clamp transistors and a plurality of clamp diodes, each clamp diode of the plurality coupled in series with a respective clamp transistor and in anti-series with a body diode of the respective clamp transistor; and
a clamp reset block including a plurality of diodes, each diode of the plurality being coupled between a conduction terminal of a clamp transistor and a conduction terminal of a buffer transistor.

17. The system of claim 16, further comprising a level shifter coupled to the high-voltage buffer block.

18. The system of claim 16, further comprising an anti-noise block coupled to the high-voltage clamp.

19. The system of claim 18, further comprising a high-voltage switch coupled to the anti-noise block.

20. The system of claim 16, further comprising a piezoelectric transducer coupled to the voltage clamp.

21. The system of claim 20, further comprising an anti-noise block coupled between the piezoelectric transducer and the high-voltage clamp.

22. A transmission channel, comprising:
means for generating high-voltage pulses;

means for clamping an output of the transmission channel to a reference voltage; and means for biasing the transmission channel between pulses.

23. The transmission channel of claim 22 wherein the means for biasing comprises a plurality of diodes coupled between the means for generating high-voltage pulses and the means for clamping.

24. The transmission channel of claim 22, further comprising means for reducing noise coupled to the means for clamping.

25. A method, comprising:
transmitting a series of high-voltage pulses through a transmission channel;
clamping an output of the transmission channel to a reference voltage between pulses; and
biasing the transmission channel between pulses.

26. The method of claim 25, further comprising:
driving a piezoelectric transducer with the series of pulses.

27. The method of claim 25 wherein the biasing the transmission channel comprises biasing conduction terminals of transistors of a voltage clamp of the transmission channel with respect to conduction terminals of transistors of a buffer of the transmission channel.

* * * * *